United States Patent
Kimball

(10) Patent No.: US 9,065,386 B2
(45) Date of Patent: Jun. 23, 2015

(54) LOW VOLTAGE OPERATION FOR A POWER AMPLIFIER

(75) Inventor: Eric Kimball, Austin, TX (US)

(73) Assignee: Avago Technologies General IP (Singapore) Pte. Ltd., Singapore (SG)

(*) Notice: Subject to any disclaimer, the term of this patent is extended or adjusted under 35 U.S.C. 154(b) by 102 days.

(21) Appl. No.: 13/408,007

(22) Filed: Feb. 29, 2012

(65) Prior Publication Data

US 2013/0222064 A1 Aug. 29, 2013

(51) Int. Cl.
*H03F 3/45* (2006.01)
*H03F 1/02* (2006.01)
*H03F 3/21* (2006.01)
*H03F 3/24* (2006.01)

(52) U.S. Cl.
CPC ............ *H03F 1/0261* (2013.01); *H03F 1/0277* (2013.01); *H03F 3/211* (2013.01); *H03F 3/24* (2013.01); *H03F 3/45179* (2013.01); *H03F 2200/321* (2013.01); *H03F 2200/513* (2013.01)

(58) Field of Classification Search
USPC .................................................. 330/252–261
See application file for complete search history.

(56) References Cited

U.S. PATENT DOCUMENTS

| | | | |
|---|---|---|---|
| 4,580,111 A | 4/1986 | Swanson | |
| 4,593,251 A | 6/1986 | Smith | |
| 4,680,559 A | 7/1987 | Swanson | |
| 5,872,481 A | 2/1999 | Sevic et al. | |
| 6,069,525 A | 5/2000 | Sevic et al. | |
| 6,731,166 B1 | 5/2004 | Sabouri et al. | |
| 6,996,379 B2 | 2/2006 | Khorram | |
| 7,095,283 B2 | 8/2006 | Kee et al. | |
| 7,129,784 B2 | 10/2006 | Bhatti et al. | |
| 7,157,965 B1 | 1/2007 | Kim | |
| 7,215,206 B2 | 5/2007 | Dupuis et al. | |
| 7,312,654 B2 * | 12/2007 | Roeckner et al. | 330/10 |
| 7,728,661 B2 | 6/2010 | Bockelman | |
| 7,768,350 B2 | 8/2010 | Srinivasan et al. | |
| 8,086,263 B2 | 12/2011 | Castaneda et al. | |
| 8,116,700 B2 | 2/2012 | Kimball | |
| 2005/0064830 A1 | 3/2005 | Grigore | |
| 2006/0270366 A1 | 11/2006 | Rozenblit et al. | |
| 2009/0004981 A1 | 1/2009 | Eliezer et al. | |
| 2009/0278609 A1 | 11/2009 | Srinivasan | |

OTHER PUBLICATIONS

Anadigics, "AWT62778R, HELP3 PCS/WCDMA 3.4 V/29.5 dBm, Linear Power Amplifier Module, Data Sheet—Rev. 2.0," Jan. 2007, 8 pages.
RF Micro Devices, Inc., "RF2173, 3V GSM Power Amplifier, Package Style: QFN, 16-Pin, 4 ×4," 2006, 14 pages.
RF Micro Devices, Inc., "What's Next in UMTS Front-Ends," 2007, 2 pages.

* cited by examiner

*Primary Examiner* — Hieu Nguyen

(57) ABSTRACT

In one embodiment, a power amplifier may include a bridge configuration having a first pair of gain transistors to receive a first portion of a differential signal and to amplify the first portion of the differential signal to an amplified first differential signal portion and a second pair of gain transistors to receive a second portion of the differential signal and to amplify the second portion of the differential signal to an amplified second differential signal portion. This second pair of gain transistors can be configured to be enabled in a first power mode and to be disabled in a second power mode.

18 Claims, 6 Drawing Sheets

LOW VOLTAGE OPERATION FOR A POWER AMPLIFIER

BACKGROUND

Power amplifiers (PAs) are commonly used in wireless devices to amplify a signal for transmission. PAs are typically formed of multiple stages, and often include a final gain stage, commonly referred to as an output gain stage, to amplify the signal to a desired power level for its output to a load such as an antenna that radiates the amplified signal.

Wireless communication systems dictate the amount of power to be output. Different requirements may exist in different communication protocols. Many communication systems have various requirements for a handset to achieve with relation to power, efficiency, and linearity over varying signal levels. For example, a variety of communication systems, including enhanced data rates for GSM evolution (EDGE), long term evolution (LTE/4G), WiFi in accordance with an IEEE 802.11 standard, worldwide interoperability for microwave access (WiMax), code division multiple access (CDMA), and wideband-code division multiple access (W-CDMA) all have varying requirements. For example, a W-CDMA band 1 (B1) PA should be able to output approximately 30 dBm of power at an efficiency better than 40% and at a linearity of better than −40 dBc of adjacent channel leakage ratio (ACLR).

Many PAs can consume significant power in their operation. Accordingly, some PAs provide for operation at multiple supply voltage levels, where certain parts of the PA operate using a first supply voltage and other parts operate using a second, lower supply voltage. However, for certain designs of an output gain stage, it becomes difficult or impossible to operate at a low voltage that may be desired by a particular mobile platform vendor such as a cell phone vendor.

SUMMARY OF THE INVENTION

According to one aspect, the present invention includes an output stage of an amplifier that has a bridge configuration. This bridge configuration may include a first pair of gain transistors to receive a first portion of a differential signal and to amplify the first portion of the differential signal to an amplified first differential signal portion and a second pair of gain transistors to receive a second portion of the differential signal and to amplify the second portion of the differential signal to an amplified second differential signal portion. Note that this second pair of gain transistors can be configured to be enabled in a first power mode and to be disabled in a second power mode, to thus reduce power consumption of the amplifier.

To this end, the second pair of gain transistors may be coupled to a first supply voltage node configured to receive a first supply voltage in the first power mode from a battery voltage and to receive a second supply voltage in the second power mode from a voltage converter. This second supply voltage may be less than the first supply voltage such that the second pair of gain transistors can be disabled in this second power mode. In one embodiment, this second pair of gain transistors may have a body connection to receive the second supply voltage. In some embodiments, during the second power mode the second pair of gain transistors may provide capacitance compensation to an input circuit from which the differential signal is received.

Another aspect of the present invention is directed to an apparatus that includes a first input transformer to receive a first portion of a differential signal at a primary coil and to output the first differential signal portion from a secondary coil. This first input transformer is coupled to receive a first bias voltage at a center tap of the secondary coil. In addition, a second input transformer is to receive a second portion of the differential signal at a primary coil and to output the second differential signal portion from a secondary coil, where this second input transformer is coupled to receive a second bias voltage at a center tap of the secondary coil. The apparatus further includes a first pair of complementary transistors with gate terminals coupled to first terminals of the secondary coils of the first and second input transistors, and a second pair of complementary transistors with gate terminals coupled to second terminals of the secondary coils of the first and second transformers. Still further, the apparatus includes an output transformer coupled to output terminals of the first and second pairs of complementary transistors. This output transformer may include a center tap to provide a sensed voltage to a bias circuit in a first power mode and to receive a second supply voltage in a second power mode.

A still further aspect of the present invention is directed to a method for controlling a power amplifier in different power modes. In one embodiment, in a first mode of operation, p-channel metal oxide semiconductor (PMOS) devices of a bridge output stage of the power amplifier can be biased using a first reference circuit, and n-channel metal oxide semiconductor (NMOS) devices of the bridge output stage can be biased using a common mode feedback circuit that receives a sensed voltage from a center tap of an output transformer coupled to the bridge output stage. Then in a second mode of operation, the PMOS devices can be biased using a first supply voltage to disable the PMOS devices and the NMOS devices biased using a second reference circuit. Also in this second mode, the first supply voltage can be provided to the center tap of the output transformer. In addition, in this second mode the PMOS transistors can be disabled by providing the first supply voltage to a center tap of an input transformer coupled to the PMOS transistors.

DETAILED DESCRIPTION

Figure 1:
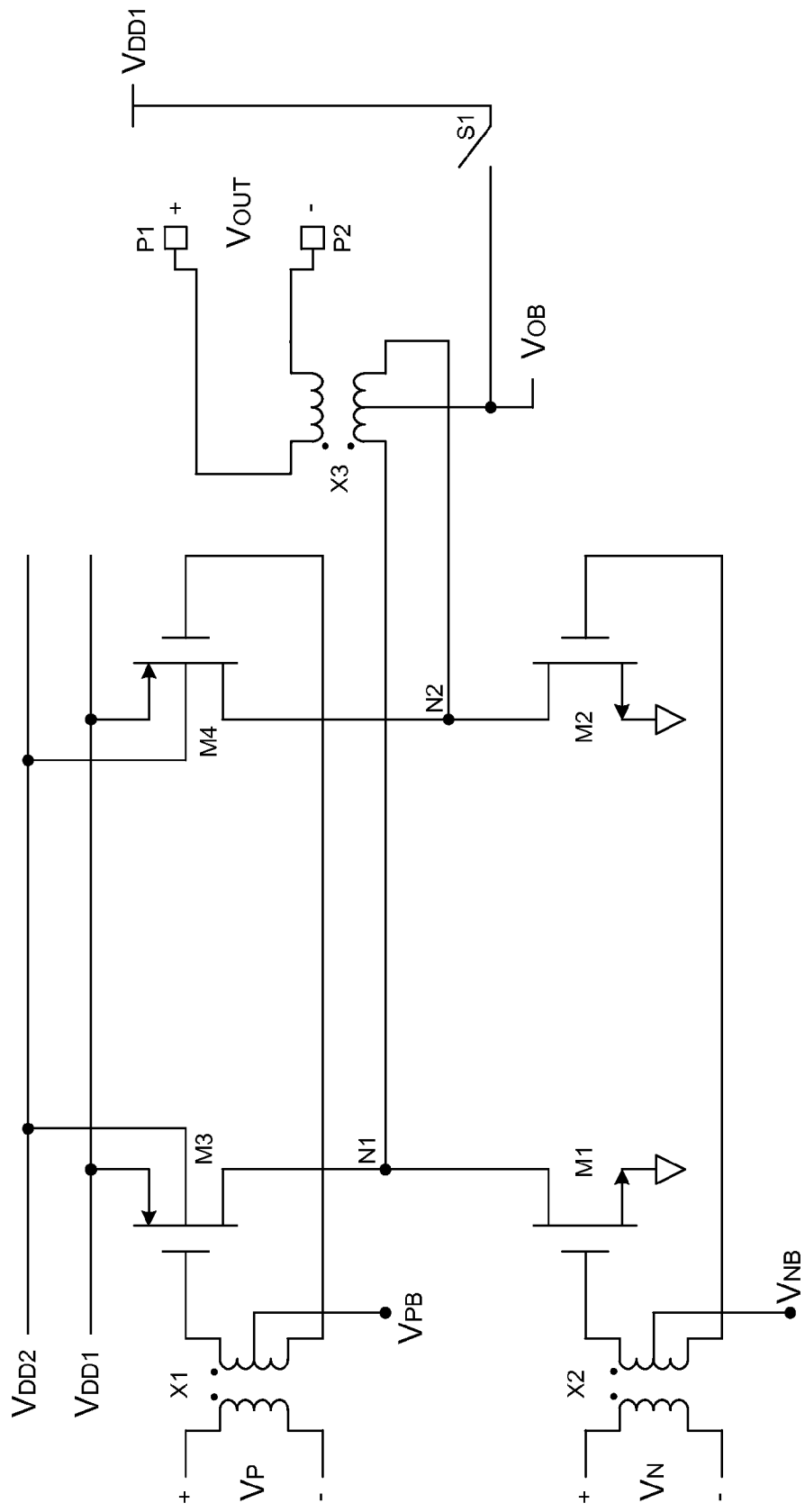
FIG. 1 is a schematic diagram of an output stage of a power amplifier (PA) in accordance with an embodiment of the present invention.

Referring now to FIG. 1, shown is a schematic diagram of an output stage of a power amplifier (PA) in accordance with an embodiment of the present invention. Output stage 100 of FIG. 1 is shown as an H-bridge stage. In general, output stage 100 includes a pair of n-channel metal oxide semiconductor (NMOS) transistors M1 and M2 and a pair of p-channel metal oxide semiconductor (PMOS) transistors M3 and M4. These transistors are configured to receive an incoming differential signal, namely a differential radio frequency (RF) signal that may be provided from another stage of the PA such as an intermediate gain stage. As seen, the positive portion of the differential RF signal (Vp) may be provided via a first input transformer X1 to drive the gate terminals of PMOS devices M3 and M4. In turn, the negative portion of the differential RF signal (Vn) may be provided via a second input transistor X2 to drive the gate terminals of NMOS devices M1 and M2. The corresponding outputs of the gain devices may be coupled via output nodes N1 and N2 to an output transformer X3 that in turn provides a differential output RF signal ($V_{out}$), which may be output from pins of the PA to a load (not shown for ease of illustration in FIG. 1). In one embodiment, the load may include an output antenna to thus communicate the output signal.

By providing an H-bridge output stage for a voltage that a given semiconductor process of which the PA is fabricated can tolerate, less physical stress on the devices occurs than other output stage configurations. This is so, as a limited amount of voltage is provided across this stage. In addition, greater gain may be possible as the PMOS devices and the NMOS devices act like they are in parallel.

As further illustrated in FIG. 1, the source terminals of PMOS devices M3 and M4 may be coupled to a first supply voltage, $V_{DD1}$, via coupling to a first supply voltage line. In turn, a body connection of PMOS devices M3 and M4 may be coupled to a second supply voltage, $V_{DD2}$, via coupling to a second supply voltage line. As will be described further below, in a normal mode of operation in which the PA is to operate according to a higher voltage, e.g., a battery voltage, such as a 3.4 V level, both $V_{DD1}$ and $V_{DD2}$ may be at this same battery voltage level, e.g., via an off-chip connection that couples the same voltage to the two supply lines. In contrast, during a low power mode in which the PA is to operate at a lower voltage, e.g., at a 0.5 V or even lower level, the $V_{DD1}$ value may be at this lower voltage, which can be received via a DC-DC converter. In such mode, PMOS devices M3 and M4 may essentially be disabled such that they do not contribute to the power consumption of the PA, and instead the output signal may be contributed solely from the differential signal provided to NMOS devices M1 and M2.

As seen, a bias voltage ($V_{PB}$) for PMOS devices M3 and M4 may be provided via a bias voltage node $V_{PB}$ coupled to a center tap of the secondary coil of transformer X1. And similarly, a bias voltage ($V_{NB}$) for NMOS devices M1 and M2 may be provided via a bias voltage node $V_{NB}$ coupled to a center tap of the secondary coil of transformer X2. Further, as will be described herein, an output voltage node ($V_{OB}$) may be coupled to a center tap of the primary coil of output transformer X3. During normal operation mode, this output voltage node can float with the output to thus provide a sensed voltage that can be used by a feedback circuit to generate the bias voltage for one of the PMOS or NMOS sets of devices. Instead during a low power mode, a switch Si may be closed to couple this output voltage node to a supply voltage, namely $V_{DD1}$. In this mode, this output voltage node does not act as a sensed voltage for a feedback circuit and thus bias voltages may be generated in another way during this low voltage mode. Although shown at this high level of configuration in the embodiment of FIG. 1, understand the scope of the present invention is not limited in this regard.

In the first mode of operation of output stage 100, which is the standard H-bridge mode of operation at typical battery voltages (e.g., 3.4 volts), the PMOS and NMOS gain stages contribute equally to the output signal. An RF signal is applied to the primary coils of transformers X1 and X2 and the resulting output current, which is driven into transformer X3 is given by $IX_3 = V_p gm_p + V_n gm_n$, where gm is the transconductance of the respective transistors. In one embodiment, the bias voltages are set by sensing the voltage $V_{OB}$ and servo'ing either $V_{PB}$ or $V_{NB}$ to obtain the correct common mode voltage at $V_{OB}$. If $V_{PB}$ is servo'ed, then $V_{NB}$ is set by a reference voltage to obtain the correct bias current in the gain stage. If $V_{NB}$ is servo'ed, then $V_{PB}$ is set by a reference voltage. Thus, a common mode feedback circuit may be coupled to receive the output voltage and through feedback adjust a first bias voltage (for purposes of discussion assume for the NMOS gain devices). The second bias voltage (for purposes of discussion assume for the PMOS gain devices) may be set at a fixed value from a reference circuit to set the current to a particular level.

In the second mode of operation, which is intended for low voltage operation, the PMOS portion of the gain stage is disabled. To accomplish this several operations may be performed. First, $V_{OB}$ is set to the same voltage as $V_{DD1}$. This can be accomplished by either shorting $V_{OB}$ to $V_{DD1}$ with a switch (e.g., S1 in FIG. 1), or by driving $V_{OB}$ with a regulator. Here, $V_{OB}$ is no longer a sensed voltage. $V_{PB}$ is then set to a voltage that will guarantee that the PMOS devices remain off, even with the RF voltage swing generated by $V_P$. In one embodiment, this can be realized by coupling the center tap of the secondary coil of input transformer X2 to a supply voltage (more specifically $V_{DD1}$). The $V_{NB}$ is set by a reference voltage to bias the NMOS devices with the correct bias current. This bias current flows through the center tap of output transformer X3 and is provided by the source that is generating the voltage $V_{OB}$.

In this mode of operation $V_{DD2}$ may be a larger voltage than $V_{DD1}$ in order to prevent the parasitic diodes of the PMOS devices from turning on. In this way, the voltage $V_{DD1}$ can drop to much lower voltages than would be possible if the output stage remained in a balanced PMOS and NMOS configuration. This is partly because the NMOS devices receive the whole $V_{DD1}$ voltage across their drain terminals via output transformer X3 to the voltage source for $V_{OB}$ and partly because the NMOS bias voltage can be supplied from $V_{DD2}$, which is a higher voltage. If the PMOS devices were to be biased in this low voltage configuration, they would require a gate bias that was a negative voltage as $V_{DD1}$ drops to very low voltages such as 0.5 V. For example if the threshold voltage of the PMOS device is 1 V and the device requires an additional 0.1 V of bias voltage then when $V_{DD1}$ is 0.5 V, a bias voltage of 0.5 V−1 V−0.1 V=−0.6 V would be needed. However, such voltage would not be feasible without an additional package pin and regulator that is capable of providing a negative supply.

In some implementations during normal mode, it may possible to bias the PMOS and NMOS gain stages with different amounts of bias current using a configuration as in FIG. 1. As a result, a common mode feedback circuit may be eliminated, by allowing a reference voltage for the PMOS and a reference voltage for the NMOS to be applied. The resulting common mode difference current would flow into $V_{OB}$. This is in contrast to a conventional H-bridge in which the same amount of current flows through the PMOS devices and NMOS devices for a bias to maintain the output at a controlled voltage. By providing a node to a center tap of the output transformer, additional control can be provided to bias the PMOS and the NMOS devices at different currents. The extra current flowing in it can either be supplied into the center tap of the output transformer or be provided by the center tap of the output transformer. In this way the PMOS devices may be made a little smaller (e.g., between 3× and 1× of the size of a NMOS device) but more current flows through them.

Still further, appropriate biasing of the PMOS devices could also be done to use them as non-linear capacitance compensation for the NMOS devices. Note that when the PMOS devices are turned off, there are still parasitic capacitances that load the output to compensate for a non-linear capacitance presented to previous stages of the PA. This compensation can be used to balance out the AM-to-PM variation caused by the NMOS devices or by previous stages in the amplifier. For this configuration, a bias voltage can be selected for the PMOS devices such that the devices can provide some amount of non-linear compensation. More specifically, the bias voltage may be provided to turn on the devices, not to the point that they provide current, but at a point on a capacitance curve to provide compensation. Along with intentional non-linear capacitance circuitry that is provided, as described in U.S. Publication No. 2009/0243727, the disclosure of which is hereby incorporated by reference, greater control over capacitance compensation can occur.

Figure 2:
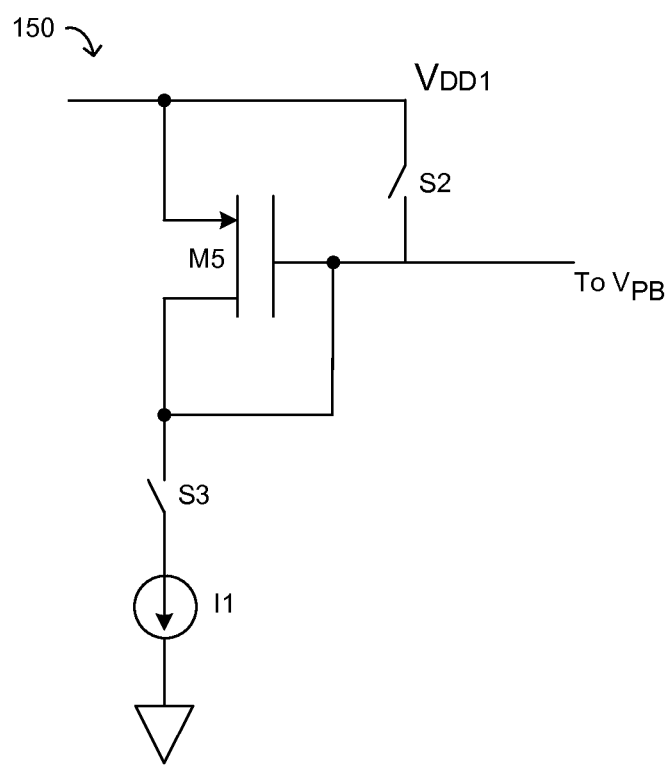
FIG. 2 is a schematic diagram of a reference voltage generator for p-channel metal oxide semiconductor (PMOS) gain devices in accordance with an embodiment of the present invention.

As described above, in different implementations, the bias voltage for one of the NMOS and PMOS gain devices can be by way of a common mode feedback circuit and the other controlled by a reference voltage. Referring now to FIG. 2, shown is a schematic diagram of a reference voltage generator for the PMOS gain devices in accordance with an embodiment of the present invention. As shown in FIG. 2, reference circuit 150 can be used to generate the bias voltage for the PMOS devices during a normal mode of operation. In this normal mode of operation, switch S2 may be open while switch S3 is closed. The reference circuit can include a PMOS device M5, which may be sized substantially the same as one of the gain devices (M3 or M4), or may be sized as 1× device where the PMOS gain devices are a size Mx, where M is an integer value. PMOS device M5 may be in a diode configuration having a source terminal coupled to a supply voltage (e.g., $V_{DD1}$), a drain terminal coupled to a current source I1 (via closed switch S3) and a gate terminal that is commonly coupled with the drain terminal to provide the bias voltage. Instead during a low voltage mode of operation, switch S3 is open and switch S2 is closed such that the bias voltage provided to the PMOS devices may be set equal to the supply voltage $V_{DD1}$. In the low voltage mode, this supply voltage is at a low voltage (e.g., 0.5 V), and thus the bias voltage provided ensures that the PMOS devices of the gain stage remain powered off. For non-linear compensation the value of current I1 can be adjusted to much smaller values, or the node can be connected to another bias circuit which provides a lower voltage that keeps the device in the high impedance state for the drain while also providing the correct capacitance. Although shown with this particular implementation in the embodiment of FIG. 2, understand the scope of the present invention is not limited in this regard. Instead in other embodiments, rather than providing a fixed reference voltage via this replica circuit, a common mode feedback circuit can be used to generate the bias voltage for the PMOS devices.

Figure 3:
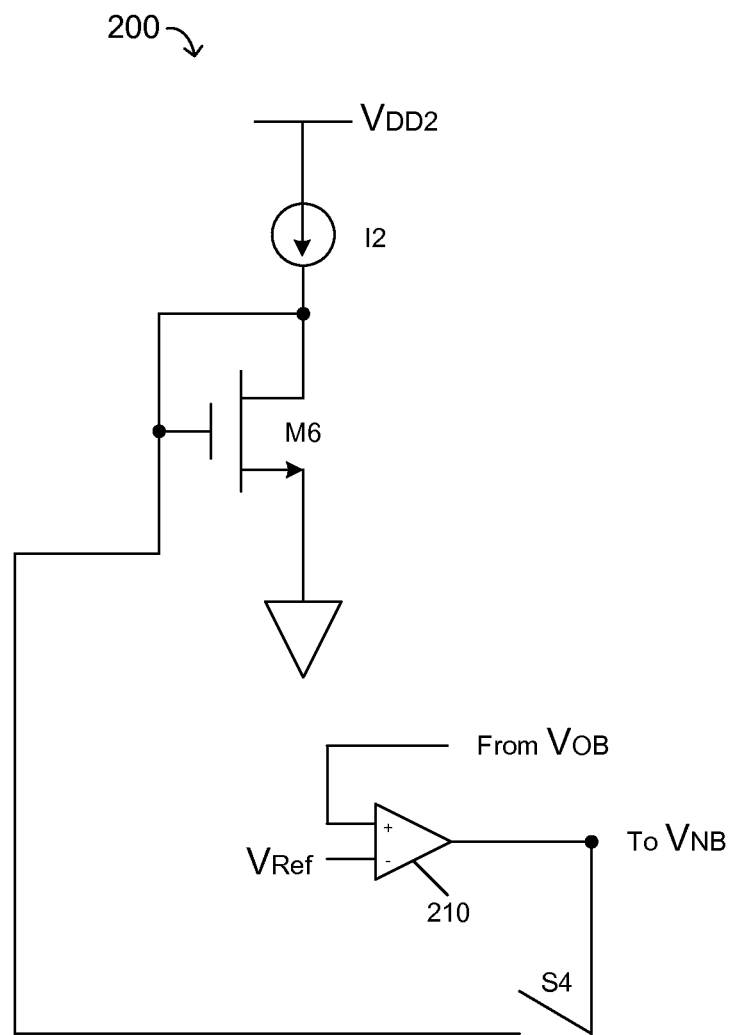
FIG. 3 is a schematic diagram of a bias voltage generation circuit for n-channel metal oxide semiconductor (NMOS) gain devices in accordance with an embodiment of the present invention.

Referring now to FIG. 3, shown is a schematic diagram of a bias voltage generation circuit for NMOS gain devices in accordance with an embodiment of the present invention. As shown in FIG. 3, a bias circuit 200 may be configured to provide the bias voltage for the NMOS devices of the gain stage. As seen, during a normal mode of operation, switch S4 may be opened and a feedback circuit 210, which may be implemented in the embodiment shown as an amplifier configured to receive a sensed output voltage, e.g., from the center tap of an output transformer (with regard to FIG. 1 at the center tap of the primary coil of transformer X3). In turn, this sensed voltage can be compared to a reference voltage $V_{ref}$ provided to a negative input terminal of the amplifier. Based on the comparison, the bias voltage may be set accordingly. Note that in other embodiments, a resistor divider may be coupled to the output nodes N1 and N2 and the sensed voltage provided to feedback circuit 210 from an intra-resistor node.

Instead in a low power mode, the sensed voltage is no longer available as discussed above. Accordingly, circuit 200 may provide a bias voltage using a replica circuit including an NMOS device M6 having a source terminal coupled to a ground voltage, and a drain terminal coupled to a current source 12 (in turn coupled to supply voltage $V_{DD2}$). This NMOS device may be sized substantially the same as the NMOS devices of the NMOS gain stage or may be sized as a 1× device where the NMOS gain devices are a size Mx, where M is an integer value. As seen, with this diode-connected configuration, a bias voltage can be provided to the bias voltage node $V_{NB}$.

Figure 4:
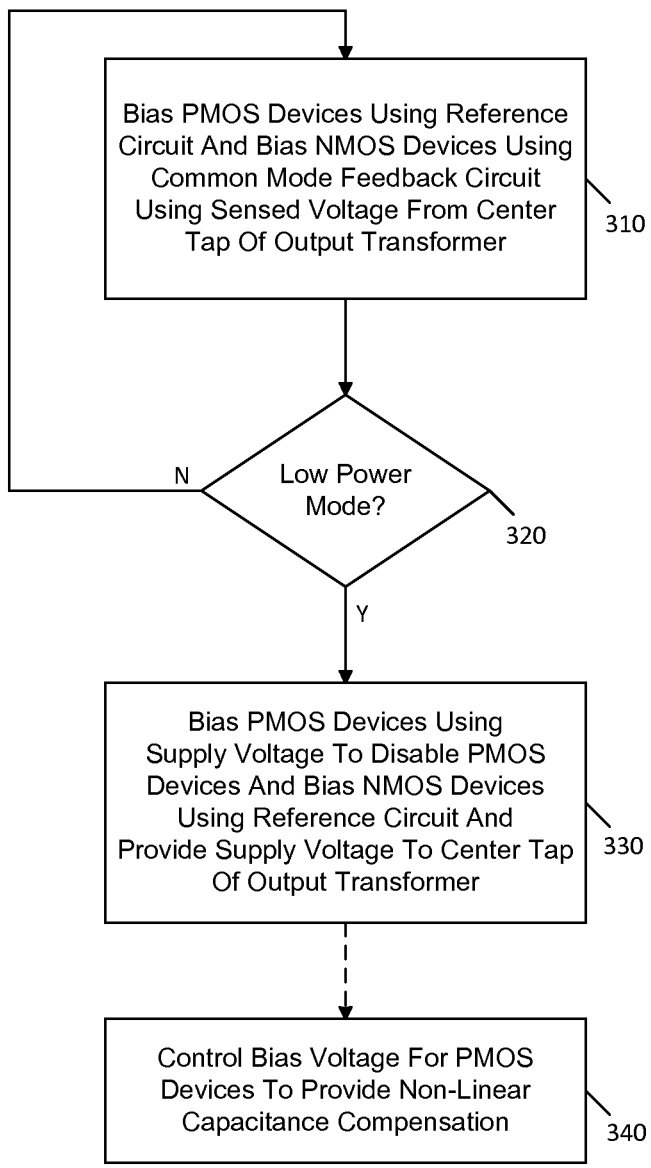
FIG. 4 is a flow diagram of a method in accordance with one embodiment of the present invention.

Referring now to FIG. 4, shown is a flow diagram of a method in accordance with one embodiment of the present invention. More specifically, method 300 shown in FIG. 4 illustrates operation of an H-bridge output stage such as described above. As seen, normal operation occurs at block 310 where PMOS devices can be biased using a reference circuit and NMOS devices can be biased using a common mode feedback circuit that uses a sensed voltage from a center tap of an output transformer. Note that in other embodiments it is possible for the PMOS devices to be biased using a voltage obtained from the common mode feedback voltage and instead the NMOS devices biased using a reference circuit.

However as to FIG. 4, in normal operation, namely at a high power mode such as at operation from a battery voltage, both the PMOS and NMOS devices are enabled for outputting current that is combined to output an amplified signal. Still referring to FIG. 4, next it can be determined whether a low power mode is desired (diamond 320). This determination can occur in various manners. For example, a controller such as a baseband processor, applications processor, microcontroller or so forth can determine, e.g., based on usage of a mobile station including the PA that it is appropriate to enter into a low power mode. This may be so, in order to lower the supply voltage and increase the efficiency when the PA is transmitting at a power level which is lower than the maximum. This may occur when the user is close to a base station or when interference is at a minimum for example. In addition some technologies, such as LTE, have a high peak-to-average signal ratio at the output. By minimizing the supply voltage when the output power is near the average and by increasing the supply voltage when the signal is near a peak, a high level of efficiency can be maintained.

If entry into low power mode is desired, control passes to block 330. There, under control of, e.g., logic, firmware, or other hardware or software control, various switching operations and circuit changes can occur in the PA. More specifically as seen at block 330, the PMOS devices can be biased to be disabled and instead the NMOS devices can be biased using a reference circuit. In one embodiment, the PMOS devices can be disabled by biasing them with a supply voltage that is approximately at the same level as a supply voltage provided to first (e.g., source) terminals of the PMOS devices such that the devices remain powered off. Furthermore, because in this low power mode, instead of receiving a sensed voltage from an output transformer's center tap, a supply voltage is provided to this center tap, the NMOS devices can be biased using a reference circuit.

Still referring to FIG. 4, as an option, it is possible to provide some amount of non-linear capacitance compensation using the disabled PMOS devices. Namely, these devices can be provided with some amount of bias voltage such that they can be used to provide non-linear capacitance compensation, but not sufficient enough to provide output current. As examples, assuming that a supply voltage of 0.5 volts is applied to the source terminals of these PMOS devices, a bias voltage of between approximately 0 and 0.5 volts (assuming that the threshold voltage of the PMOS is greater than 0.5 V) can be applied, e.g., via a node coupled to the center tap of the input transformer coupled to the PMOS devices to enable this capacitance compensation. Although shown at this high level in the embodiment of FIG. 4, understand the scope of the present invention is not limited in this regard.

Figure 5:
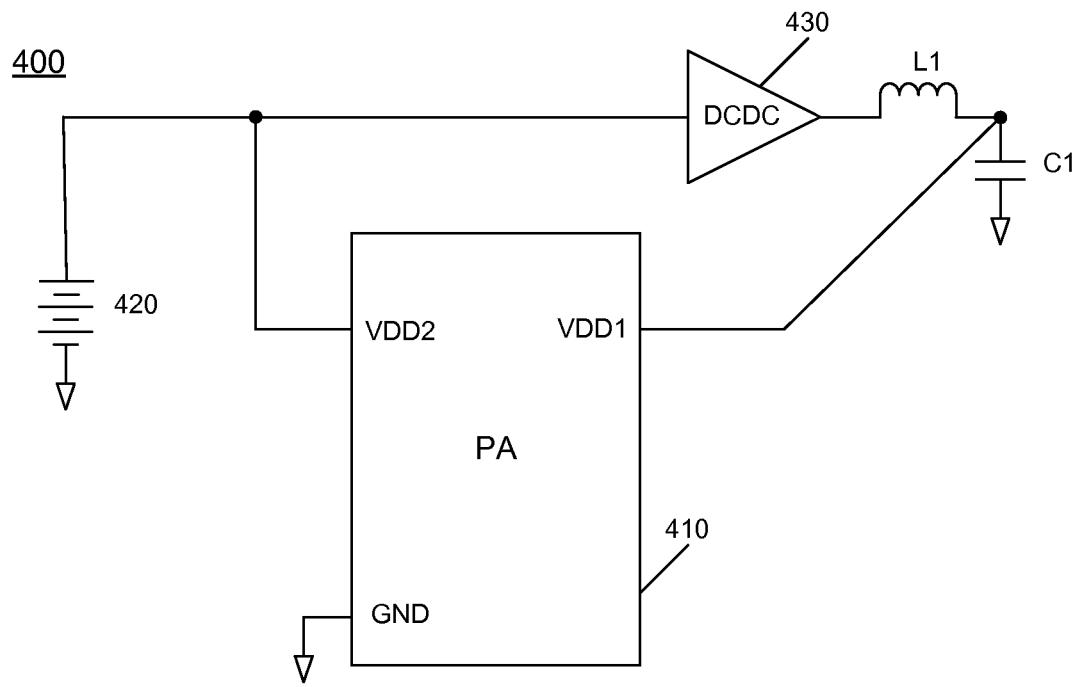
FIG. 5 is a block diagram of connection of a power amplifier in a system in accordance with an embodiment of the present invention.

Referring now to FIG. 5, shown is a block diagram of connection of a power amplifier in accordance with an embodiment of the present invention. Specifically, shown in FIG. 5 is a portion of a system 400 that includes a PA 410 in accordance with an embodiment of the present invention. To enable low voltage operation as described herein, multiple voltages can be coupled to pins of the PA. As shown in FIG. 5, PA 410 may be coupled to receive a battery voltage ($V_{bat}$) provided by a battery 420 via a pin of PA 410 that is coupled to a second voltage supply line $V_{DD2}$, e.g., shown in FIG. 1. As also seen, a reference voltage, namely ground voltage can be coupled to PA 410 via another pin of the PA.

Furthermore to enable low voltage operation in accordance with an embodiment of the present invention, another voltage signal, provided at an output of a DC-DC converter 430, may be coupled to yet another pin of the PA that in turn is coupled to a first supply voltage line $V_{DD1}$, e.g., shown in FIG. 1. In the embodiment shown in FIG. 5, this voltage signal can be provided via an inter-filter node coupled between an inductor L1 and a capacitor C1 coupled at the output of DC-DC converter 430.

During normal operation of system 400, both voltage signals received by PA 410 may be at substantially the same voltage level as discussed above (the voltage at the DC-DC converter output may have some small drop due to the converter). However, during a low power mode the voltage provided to the $V_{DD1}$ supply voltage line may be at a substantially lower value, enabling low power operation as described herein. Although not shown for ease of illustration, understand that additional pins may be provided on PA 410, including at least an input pin and an output pin (which may each comprise two pins for differential operation).

Figure 6:
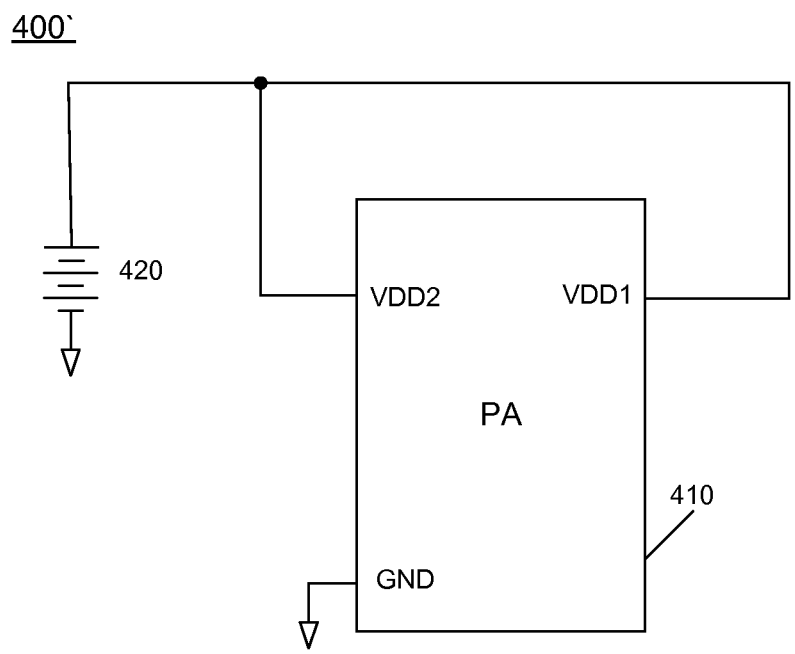
FIG. 6 is a block diagram of connection of a power amplifier in a system in accordance with another embodiment of the present invention.

For implementation instead into a system that does not provide for a low voltage mode, reference can be made to the block diagram of FIG. 6. Specifically FIG. 6 shows a block diagram of a system 400' in which the same voltage signal, namely the output of battery 420 is provided to both pins that in turn couple to both supply voltage lines $V_{DD1}$ and $V_{DD2}$.

Figure 7:
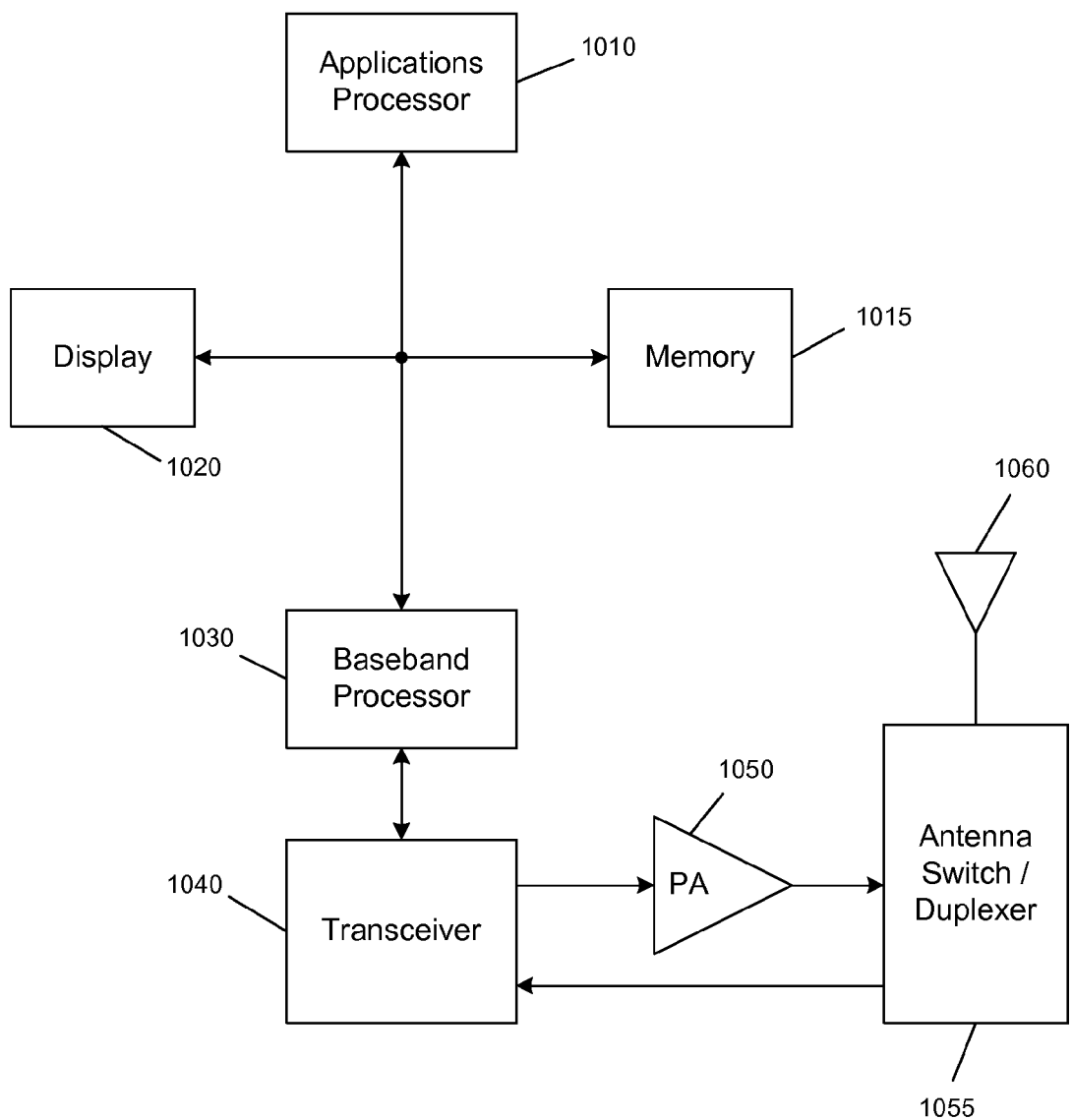
FIG. 7 is a block diagram of a wireless device in accordance with an embodiment of the present invention.

As described above, an output gain stage in accordance with an embodiment of the present invention can be implemented in a CMOS PA. Such a device can be used in various wireless systems, including handsets, mobile devices, PDAs, tablets and so forth. Referring now to FIG. 7, shown is a block diagram of a wireless device 1000 in accordance with an embodiment of the present invention. As shown in FIG. 7, wireless device 1000 may include an applications processor 1010 which may be a microprocessor or other programmable logic to handle various system features, such as running application programs desired by a user. To perform its functions, applications processor 1010 may communicate with a memory 1015, which may be a flash memory or other non-volatile memory. Applications processor 1010 may further communicate with a display 1020, such as an LCD display of the system. For handling RF communications, e.g., wireless phone calls, wireless data transmissions and so forth, e.g., according to a communications protocol such as GSM/EDGE, W-CDMA, or LTE, applications processor 1010 may communicate with a baseband processor 1030, which may handle baseband operations both for transmit and receive paths. In turn, baseband processor 1030 is coupled to a transceiver 1040, which may receive incoming baseband signals from baseband processor 1030, and perform processing to upconvert the signals to RF levels for transmission to a PA 1050. PA 1050 may be a power amplifier in accordance with an embodiment of the present invention that includes an H-bridge output gain stage. In some embodiments, control information from baseband processor 1030 may be coupled through transceiver 1040 to PA 1050. In turn, PA 1050 may be coupled to an antenna switch, duplexer or both 1055 which in turn is coupled to an antenna 1060, which radiates the amplified RF signal.

In various embodiments, baseband processor 1030 may send varying control information to PA 1050 to enable it to operate at different power levels, based upon a desired output power level as dictated by different communication schemes. In this way, baseband processor 1030 may perform transmit power control. To do so, in various implementations baseband processor 1030 may send control information to control the switching and biasing of the output gain stage as described above.

As further shown in FIG. 7, in a receive path, antenna 1060 couples through antenna switch 1055 and possibly through the duplexer or SAW filters and then to transceiver 1040, which may demodulate the incoming RF signals back to baseband for transmission to baseband processor 1030 for further processing. While shown with this particular implementation in the embodiment of FIG. 7, the scope of the present invention is not limited in this regard.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
an output stage having a bridge configuration including a first pair of gain transistors to receive a first portion of a differential signal and to amplify the first portion of the differential signal to an amplified first differential signal portion and a second pair of gain transistors to receive a second portion of the differential signal and to amplify the second portion of the differential signal to an amplified second differential signal portion, the second pair of gain transistors configured to be enabled in a first power mode and to be disabled in a second power mode, wherein the second pair of gain transistors are coupled to a first supply voltage node configured to receive a first supply voltage in the first power mode from a battery voltage and to receive a second supply voltage in the second power mode from a voltage converter, the second supply voltage less than the first supply voltage, wherein the second pair of gain transistors have a body connection coupled to a second supply voltage node configured to receive the second supply voltage.

2. The apparatus of claim 1, further comprising a first input transformer to provide the first portion of the differential signal to the first pair of gain transistors, the first input transformer coupled to receive a first bias voltage at a center tap of the first input transformer.

3. The apparatus of claim 2, wherein the first pair of gain transistors are to receive the first bias voltage in the first power mode from a feedback circuit and to receive the first bias voltage in the second power mode from a reference circuit, wherein the second bias voltage is greater than the first bias voltage, wherein the first pair of gain transistors are coupled to the same voltage in the first and second power modes.

4. The apparatus of claim 2, further comprising a second input transformer to provide the second portion of the differential signal to the second pair of gain transistors, the second input transformer coupled to receive a second bias voltage at a center tap of the second input transformer, 5. The apparatus of claim 2, further comprising an output transformer coupled to output terminals of the first and second pairs of gain transistors, the output transformer having a center tap to provide a sensed voltage to a bias generation circuit in the first power mode and coupled to receive the second supply voltage in the second power mode.

6. The apparatus of claim 5, further comprising, a switch to couple the center tap of the output transformer to the second supply voltage in the second power mode and to couple the center tap to the bias generation circuit or to leave the center tap floating in the first power mode, 7. The apparatus of claim 5, wherein the bias generation circuit comprises a feedback circuit to receive the sensed voltage from the center tap of the output transformer and an amplifier to compare the sensed voltage to a reference voltage and to output the first bias voltage to the first pair of gain transistors during the first power mode.

8. The apparatus of claim 7, further comprising a first reference circuit to generate a second bias voltage for the second pair of gain transistors, the first reference circuit including a first transistor having a drain-source path coupled between the first supply voltage node and a current source and to provide the second bias voltage during, the first power mode.

9. The apparatus of claim 8, wherein the first reference circuit further includes a first switch to decouple the current source from the drain-source path and a second switch to provide the second supply voltage as the second bias voltage in the second power mode.

10. The apparatus of claim 8, further comprising a second reference circuit to generate the first bias voltage for the first pair of gain transistors, the second reference circuit including a second transistor having a drain-source path coupled between a second current source and a reference potential and to provide the first bias voltage during the second power mode, wherein the feedback circuit is to be disabled during the second power mode.

11. The apparatus of claim 1, wherein in the second power mode, the second pair of gain transistors is to provide capacitance compensation to an input circuit from which the differential signal is received, the second pair of gain transistors to provide the capacitance compensation but not to provide output current.

12. An apparatus comprising:
a first input transformer to receive a first portion of a differential signal at a primary coil and to output the first differential signal portion from a secondary coil, the first input transformer coupled to receive a first bias voltage at a center tap of the secondary coil;
a second input transformer to receive a second portion of the differential signal at a primary coil and to output the second differential signal portion from a secondary coil, the second input transformer coupled to receive a second bias voltage at a center tap of the secondary coil;
a first pair of complementary transistors having gate terminals coupled to first terminals of the secondary coils of the first and second input transistors: a second pair of complementary transistors having gate terminals coupled to second terminals of the secondary coils of the first and second transformers; and
an output transformer coupled to output terminals of the first and second pairs of complementary transistors, the output transformer having a center tap to provide a sensed voltage to a bias circuit in a first power mode and to receive a second supply voltage in a second power mode.

13. The apparatus of claim 12, wherein first transistors of the first and second pairs of complementary transistors are coupled to receive the first bias voltage from the center tap of the secondary coil of the first input transformer.

14. The apparatus of claim 13, wherein second transistors of the first and second pairs of complementary transistors are coupled to receive the second bias voltage from the center tap of the secondary coil of the second input transformer.

15. The apparatus of claim 13, wherein the first transistors of the first and second complementary pairs of transistors are configured to be disabled in the second power mode via application of a third bias voltage less than the first bias voltage and coupling of the second supply voltage to a supply voltage node coupled to the first transistors of the first and second complementary pairs of transistors, the second supply voltage less than a first supply voltage coupled to the supply voltage node in the first power mode.

16. A method comprising; biasing, in a first mode, a plurality of p-channel metal oxide semiconductor (PMOS) devices of a bridge output stage of a power amplifier using a first reference circuit and biasing a plurality of n-channel metal oxide semiconductor (N MOS) devices of the bridge output stage using a common mode feedback circuit that receives a sensed voltage from a center tap of an output transformer coupled to the bridge output stage; and biasing, in a second mode, the plurality of PMOS devices using a first supply voltage to disable the plurality of PMOS devices and biasing the plurality of N MOS devices using a second reference circuit and providing the first supply voltage to the center tap of the output transformer.

17. The method of claim 16, further comprising disabling the plurality of PMOS transistors by providing the first supply voltage to a center tap of an input transformer coupled to the plurality of PMOS transistors.

18. The method of claim 16, further comprising controlling the biasing of the plurality of PMOS devices in the second mode to provide non-linear capacitance compensation.

* * * * *